United States Patent
Seo et al.

(10) Patent No.: US 7,820,477 B2
(45) Date of Patent: Oct. 26, 2010

(54) ORGANIC THIN FILM TRANSISTOR ARRAY SUBSTRATE AND FABRICATION METHOD THEREOF

(75) Inventors: Hyun Sik Seo, Anyang-si (KR); Nack Bong Choi, Uiwang-si (KR)

(73) Assignee: LG. Display Co., Ltd., Seoul (KR)

( * ) Notice: Subject to any disclaimer, the term of this patent is extended or adjusted under 35 U.S.C. 154(b) by 0 days.

(21) Appl. No.: 12/549,032

(22) Filed: Aug. 27, 2009

(65) Prior Publication Data

US 2009/0317941 A1    Dec. 24, 2009

Related U.S. Application Data

(63) Continuation of application No. 11/599,559, filed on Nov. 14, 2006, now Pat. No. 7,602,464.

(30) Foreign Application Priority Data

Apr. 27, 2006    (KR) ..................... 10-2006-0038241

(51) Int. Cl.
*H01L 51/40*    (2006.01)
*H01L 21/4763*    (2006.01)
*G02F 1/136*    (2006.01)
*G02F 1/1333*    (2006.01)

(52) U.S. Cl. ..................... 438/99; 438/623; 349/47; 349/138

(58) Field of Classification Search ............ 349/47, 349/138; 438/99, 623
See application file for complete search history.

(56) References Cited

U.S. PATENT DOCUMENTS

2005/0140890 A1*    6/2005    Kim et al. ............... 349/139

FOREIGN PATENT DOCUMENTS

| JP | 03-145767 | 6/1991 |
| JP | 2001-196591 | 7/2001 |
| JP | 2004-006827 | 1/2004 |

OTHER PUBLICATIONS

Office Action issued in corresponding Japanese Patent Application No. 2006-324196; mailed Jul. 28, 2009.

* cited by examiner

*Primary Examiner*—Uyen-Chau N Le
*Assistant Examiner*—Kajli Prince
(74) *Attorney, Agent, or Firm*—Brinks Hofer Gilson & Lione

(57) ABSTRACT

An organic TFT array substrate and a fabricating method thereof are disclosed. In the organic TFT array substrate, a data line is disposed on a substrate and a gate line crosses the data line. A source electrode is connected to the data line. A drain electrode is disposed a predetermined distance from the source electrode. An organic semiconductor layer forms a channel between the source electrode and the drain electrode. An organic gate insulating film is disposed on the organic semiconductor layer with the same pattern as the organic semiconductor layer. A gate electrode overlies the organic semiconductor layer on the organic gate insulating film. A gate photo-resist pattern disposed on the gate electrode is used to form the gate electrode. A pixel electrode is connected to the drain electrode.

13 Claims, 20 Drawing Sheets

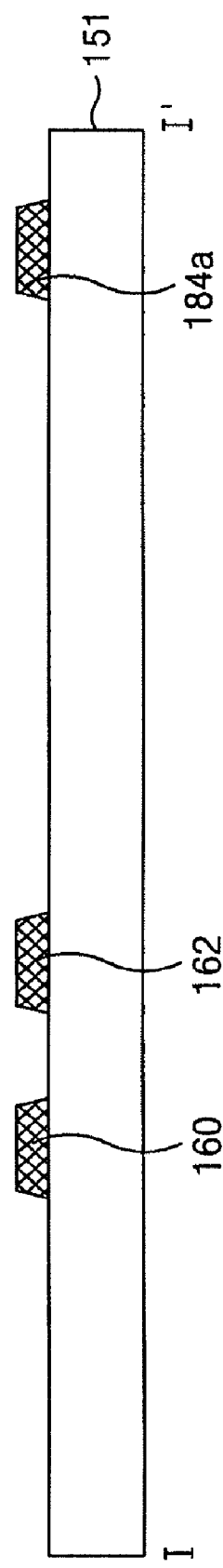

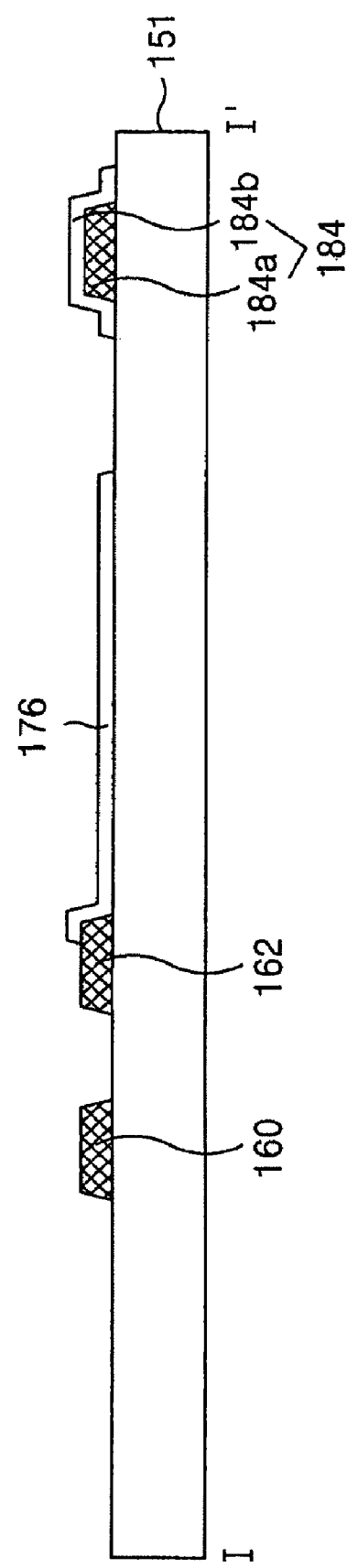

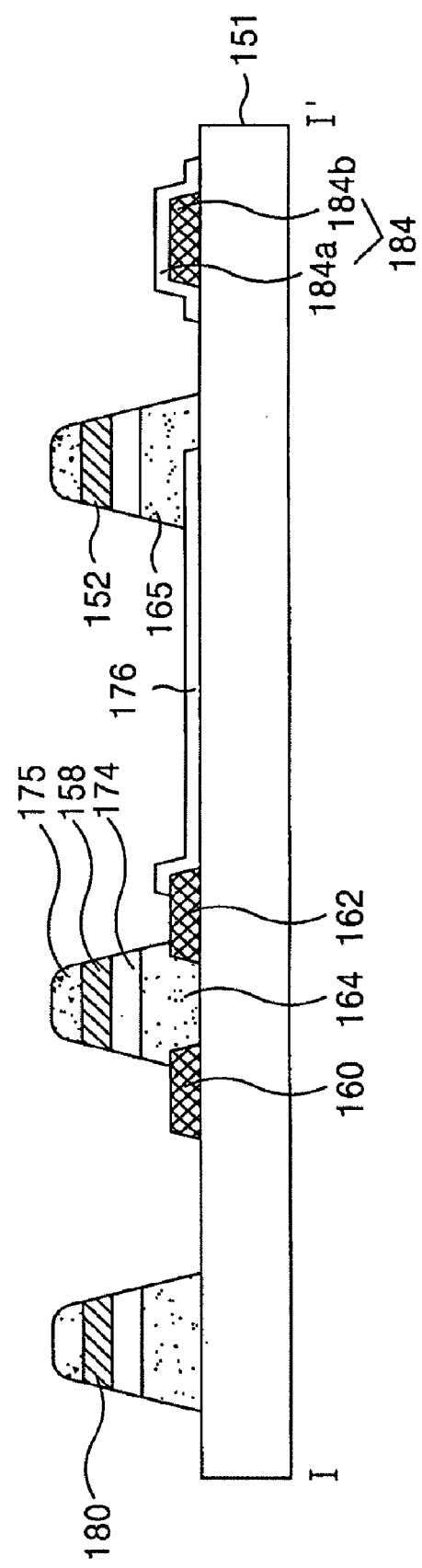

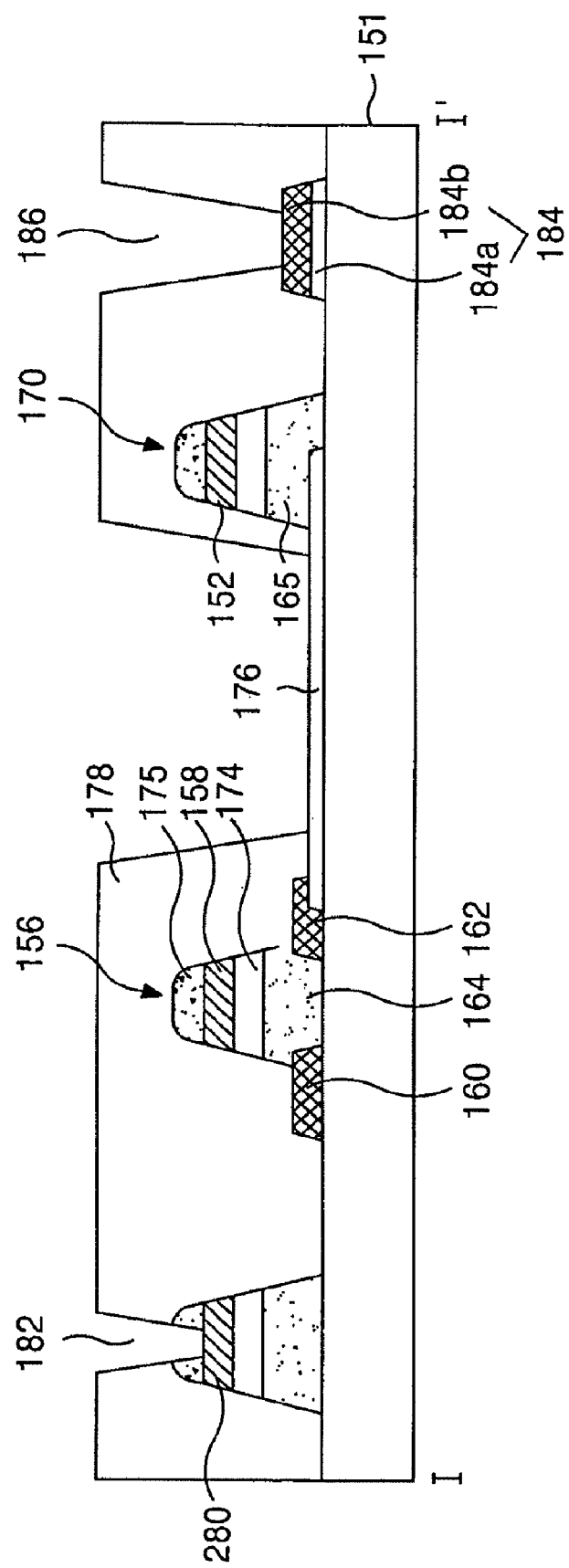

ORGANIC THIN FILM TRANSISTOR ARRAY SUBSTRATE AND FABRICATION METHOD THEREOF

RELATED APPLICATIONS

The present patent document is a divisional of U.S. patent application Ser. No. 11/599,559, filed Nov. 14, 2005, which claims priority to Korean Patent Application No. P2006-0038241 filed in Korea on Apr. 27, 2006, which is hereby incorporated by reference.

BACKGROUND

1. Field of the Invention

The present disclosure relates to an organic thin film transistor array substrate and a fabricating method thereof. More particularly, the present disclosure relates to an organic thin film transistor array substrate and a fabricating method thereof that may decrease a fabricating process number to thereby reduce a fabricating cost.

2. Description of the Related Art

Thin film transistors (or TFTs) are used as switching elements for flat panel display devices such as liquid crystal display devices in which pixels are arranged in an active matrix type or an organic electric field emission display device, for example.

FIG. 1 is a sectional view showing a thin film transistor generally used in a flat panel display device, etc.

Referring to FIG. 1, a thin film transistor 6 comprises a gate electrode 8 formed on a substrate 2 and supplied with a gate signal, a source electrode 10 supplied with a data signal, a drain electrode 12 spaced from the source electrode 10 by a channel of the thin film transistor 6, an active layer 14 overlapped with the gate electrode 8 with a gate insulating film 24 therebetween for forming the channel of the thin film transistor 6 between the source electrode 10 and the drain electrode 12, and an ohmic contact layer 16 for reducing contact resistance between the active layer 14 and the source electrode 10 and the drain electrode 12, respectively.

The thin films of the TFT 6 are made of inorganic materials. The inorganic materials are disposed on the substrate 2 by a deposition technique such as, for example, sputtering or plasma enhanced chemical vapor deposition (PECVD), and patterned to form the thin films. However, since the deposition equipment tends to be expensive, the fabricating cost of the TFT 6 may be increased by using such deposition techniques to form the inorganic thin films. Moreover, since the photolithography processes for forming the gate electrode 8, the source electrode 10, the drain electrode 12, the active layer 14 and the ohmic contact layer 16 also include exposure and development processes, the fabricating cost of the TFT 6 may be further increased.

In view of the drawbacks of thin film transistors made from inorganic materials (hereinafter, referred to as "inorganic TFT"), a thin film transistor including an organic semiconductor layer (hereinafter, referred to as "organic TFT") has been suggested.

FIG. 2 is a sectional view showing the organic TFT.

Referring to FIG. 2, an organic TFT 56 comprises a source electrode 60 formed on a substrate 52 and supplied with a data signal, a drain electrode 62 opposed to the source electrode 60 and spaced a predetermined distance from the source electrode 60, an organic semiconductor layer 64 formed over the source electrode 60 and the drain electrode 62, an organic gate insulating film 74 formed over the organic semiconductor layer 64, and a gate electrode 58 formed on the organic gate insulating film 74 and overlying the area between the source electrode 60 and the drain electrode 62.

A method of fabricating the organic TFT will be described with reference to FIG. 3A to FIG. 3D.

Referring to FIG. 3A, a source/drain metal layer is deposited on the substrate 52 by a deposition technique such as sputtering or PECVD, for example. Then, photolithography and etching processes are carried out to form the source electrode 60 and the drain electrode 62. The source/drain metal may be Au, Mo, Ti, Ta, Mo-alloy, Cu or an Al-group metal, for example.

Next, the organic semiconductor material is formed on the substrate 52 provided with the source electrode 60 and the drain electrode 62 by a method such as spin coating or spinless coating, for example, and hardened to form the organic semiconductor layer 64 shown in FIG. 3B. The organic semiconductor material may be made of, for example, a pentacene-group material, polythiophene-group material, or a polyarylamine-group material.

Next, an organic insulating material is coated on the substrate 52 provided with the organic semiconductor layer 64 by a method such as spin coating or spinless coating, for example, to form the organic gate insulating film 74 shown in FIG. 3C. The organic insulating film may be made of an acrylic organic compound such as, for example, BCB or PFCB.

After that, a gate metal layer is deposited on the gate insulating film 74 by a deposition technique such as sputtering. Then, photolithography and etching processes are carried out to form the gate electrode 58 shown in FIG. 3D. The gate metal may be Cr, Mo, Al or an Al-group metal such as AlNd, for example.

In the organic TFT 56 having the same structure as shown in FIG. 2 and formed by the method shown in FIG. 3A to FIG. 3D, the organic semiconductor layer 64 and the organic gate insulating film 74 may be formed by a relatively simple method such as spin coating or spinless coating. Accordingly, the organic TFT 56 has a simpler fabrication process than the inorganic TFT 6 with reduced usage of expensive deposition equipment. It is therefore possible to reduce the fabricating cost of the TFT.

But, the organic semiconductor layer 64 of the organic TFT 56 may be damaged by a strip liquid used for removing photo-resist to form the gate electrode 58 in a subsequent process.

Further, the organic semiconductor layer 64 of the organic TFT 56 may be deteriorated by heat in a deposition process for a transparent conductive material such as indium tin oxide (ITO) or indium zinc oxide (IZO) upon forming of a pixel electrode (not shown) in a subsequent process.

Furthermore, the organic semiconductor material for forming the organic semiconductor layer 64 of the organic TFT 56 is easily affected and deteriorated by a developer of a development process of the photolithography process for patterning as well as the strip liquid of a strip process of the photo-resist. Consequently, it is difficult to control the patterning method for forming the organic semiconductor layer 64 as a channel of the organic TFT 56. Accordingly, the organic semiconductor layer 64 may be very hard to apply to the TFT array substrate.

BRIEF SUMMARY

An organic TFT array substrate and a fabricating method thereof are described herein.

The organic TFT array substrate comprises a data line disposed on a substrate, a gate line crossing the data line; a source electrode connected to the data line; a drain electrode disposed a predetermined distance from the source electrode; an organic semiconductor layer forming a channel between the source electrode and the drain electrode; a gate electrode overlying the organic semiconductor layer on the organic gate insulating film; an organic gate insulating film disposed between the organic semiconductor layer and the gate electrode; a gate photo-resist pattern disposed on the gate electrode for forming the gate electrode; and a pixel electrode connected to the drain electrode.

The method of fabricating an organic TFT array substrate comprises the steps of forming on a substrate a source/drain metal pattern including a data line, a source electrode connected to the data line, and a drain electrode disposed a predetermined distance from the source electrode; forming a pixel electrode connected to the drain electrode; sequentially disposing an organic semiconductor material, an organic insulating material, a gate metal layer and a photo-resist film on the substrate provided with the source/drain metal pattern; patterning the photo-resist film to form a photo-resist pattern at an area to be provided a gate metal pattern; forming the gate metal pattern using the photo-resist pattern as a mask; and patterning the organic insulating material using the photo-resist pattern and the gate metal pattern as a mask to form an organic gate insulating film, and patterning the organic semiconductor material to form an organic semiconductor layer providing a channel between the source electrode and the drain electrode.

BRIEF DESCRIPTION OF THE DRAWINGS

FIG. 8A to FIG. 8F are sectional views showing steps of a method of fabricating the organic TFT array substrate according to one embodiment; and FIG. 9 is a sectional view showing an organic TFT array substrate according to another embodiment taken along the I-I' line in FIG. 6.

DETAILED DESCRIPTION OF THE DRAWINGS AND THE PRESENTLY PREFERRED EMBODIMENTS

Hereinafter, preferred embodiments will be described in detail with reference to FIG. 4 to FIG. 9.

Figure 4:
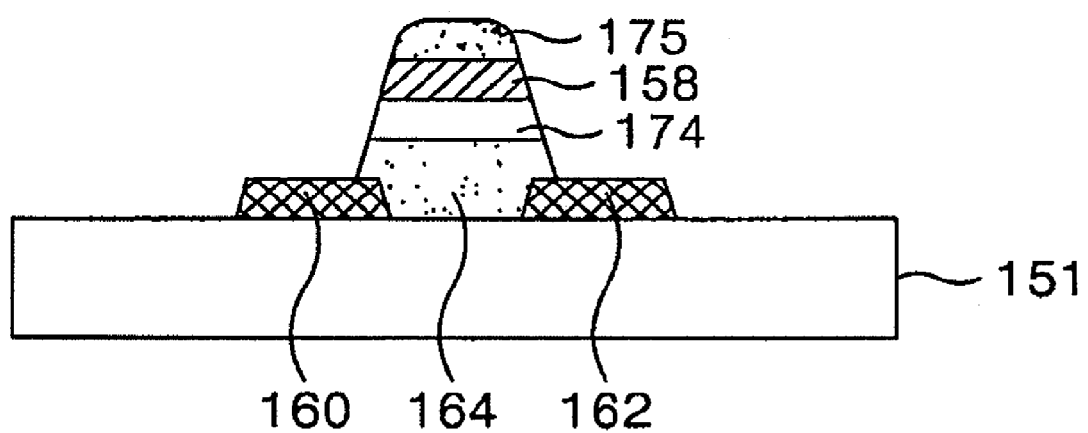
FIG. 4 is a sectional view showing an organic TFT of the present disclosure.

FIG. 4 is a sectional view showing an organic TFT.

Referring to FIG. 4, the organic TFT 156 comprises a source electrode 160 disposed on a substrate 151 and supplied with a data signal, a drain electrode 162 opposed to the source electrode 160 and disposed a predetermined distance from the source electrode 160, an organic semiconductor layer 164 forming a channel between the source electrode 160 and the drain electrode, an organic gate insulating film 174 disposed on the organic semiconductor layer 164 with the same pattern as the organic semiconductor layer 164, and a gate electrode 158 disposed on the organic gate insulating film 174 and overlying the organic semiconductor layer 164. And, the organic TFT 156 includes a gate photo-resist pattern on the gate electrode 158 for patterning the gate electrode 158.

The organic semiconductor layer 164 and the organic gate insulating film 174 of the organic TFT 156 are patterned by a dry-etching process using the gate photo-resist pattern 175 and the gate electrode 158 as a mask. Accordingly, for the organic TFT 156, the organic semiconductor layer 164 can be patterned into a channel of the organic TFT 156 without a use of a photolithography process. Then, the organic TFT 156 can easily and safely be applied to the TFT array substrate.

Hereinafter, a method of fabricating the organic TFT of the present invention will be described in detail with reference to FIG. 5A to FIG. 5D.

Figure 5A:
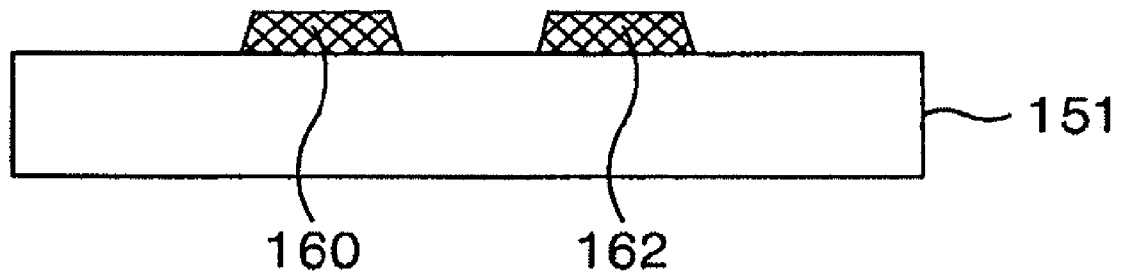
FIG. 5A to FIG. 5D are sectional views showing a step-by-step fabricating process of the organic TFT of the present disclosure.
Figure 5B:
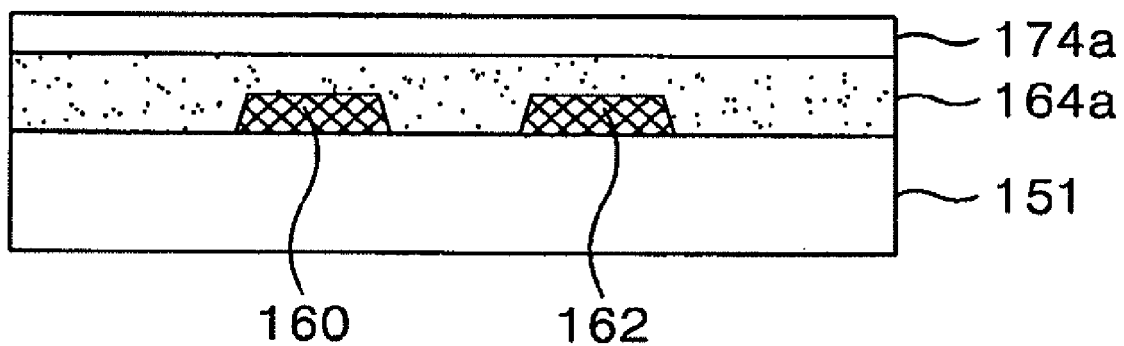

Referring to FIG. 5A, a source/drain metal layer is deposited on the substrate 151 by a deposition technique such as sputtering or PECVD, for example. Then, photolithography and etching processes are carried out to form the source electrode 160 and the drain electrode 162. The source/drain metal may be made of, for example, Au, Mo, Ti, Ta, Mo-alloy, Cu or an Al-group metal.

Next, the organic semiconductor material and the organic insulating material are sequentially coated on the substrate 151 provided with the source electrode 160 and the drain electrode 162 by a method such as spin coating or spinless coating, for example. They are then cured at a temperature of approximately 80° C.~120° C. for one to five minutes to form an organic semiconductor material layer 164a and an organic insulating material layer 174a on a whole surface of the substrate 151 shown in FIG. 5B. The organic semiconductor material may be made of a pentacene-group material, polythiophene-group material or polyarylamine-group material, for example, and the organic insulating film is made of an acrylic organic compound such as BCB or PFCB.

Figure 5C:
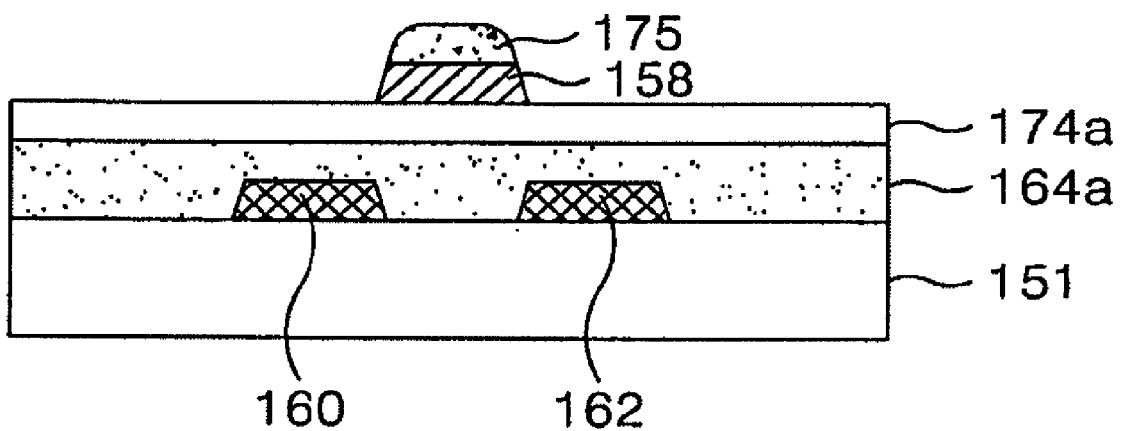

Next, a gate metal layer is deposited on the organic semiconductor material layer 164a and the organic insulating material layer 174a by a deposition technique such as sputtering, for example, and a photo-resist film is formed by a method such as spin coating or spinless coating. Next, the gate photo-resist pattern 175 is formed by photolithography and the gate electrode 158 is formed by an etching process using the gate photo-resist pattern 175 as a mask, as shown in FIG. 5C. The gate photo-resist pattern 175 may include photoacryl.

Figure 5D:
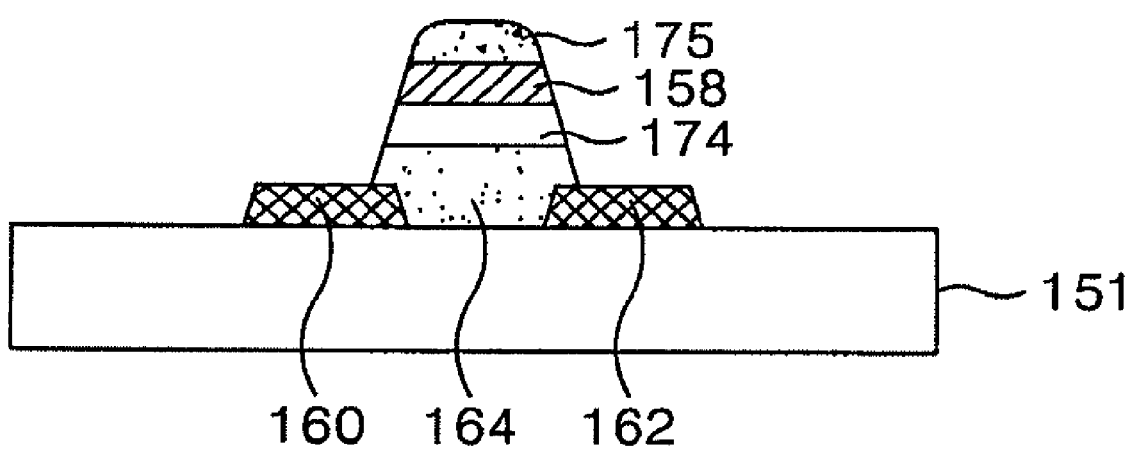

And, the organic semiconductor material layer 164a and the organic insulating material layer 174a are patterned by the dry-etching process using the gate photo-resist pattern 175 and the gate electrode 158 as a mask to form the organic semiconductor layer 164 and the organic gate insulating film 174 shown in FIG. 5D. Herein, the method of fabricating the organic TFT 156 of the present disclosure forms the organic semiconductor layer 164 and the organic gate insulating film 174, but does not remove the gate photo-resist pattern 175 on the gate electrode 158 using a strip process. The gate metal may be made of a Mo-group metal such as Mo or a Mo-alloy.

Figure 1:
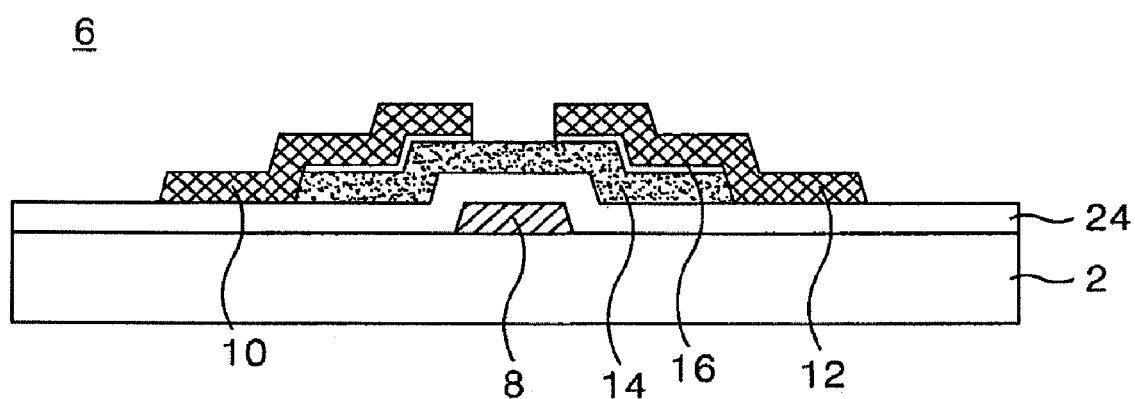
FIG. 1 is a sectional view showing a related art TFT.
Figure 2:
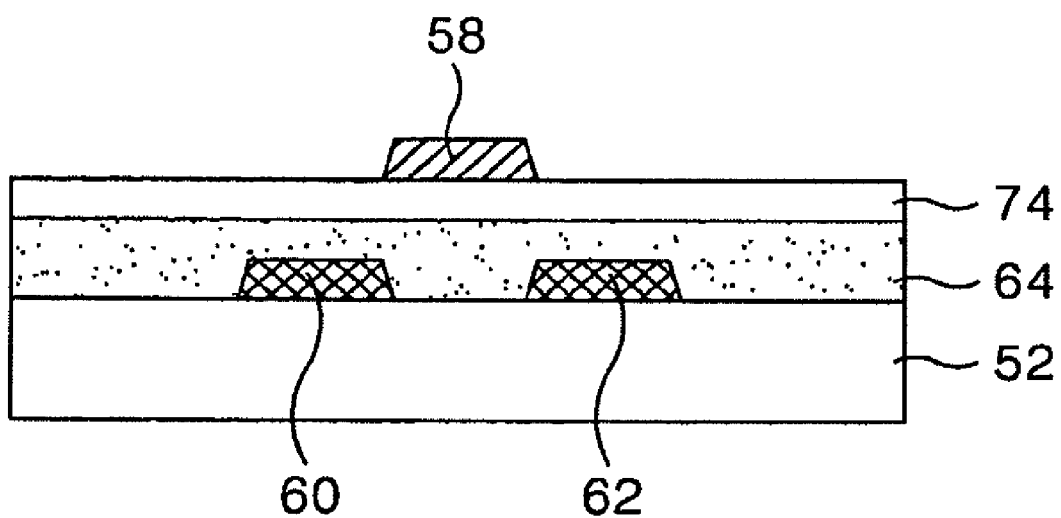
FIG. 2 is a sectional view showing a related art organic TFT.
Figure 3A:
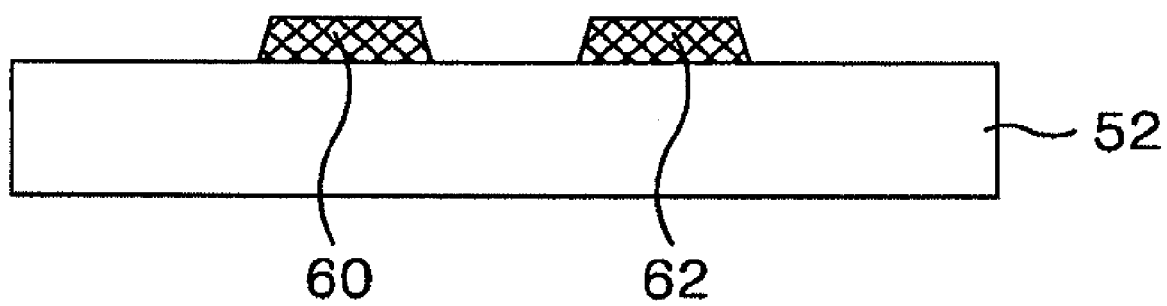
FIG. 3A to FIG. 3D are sectional views showing a step-by-step fabricating process of the organic TFT shown in FIG. 2.
Figure 3B:
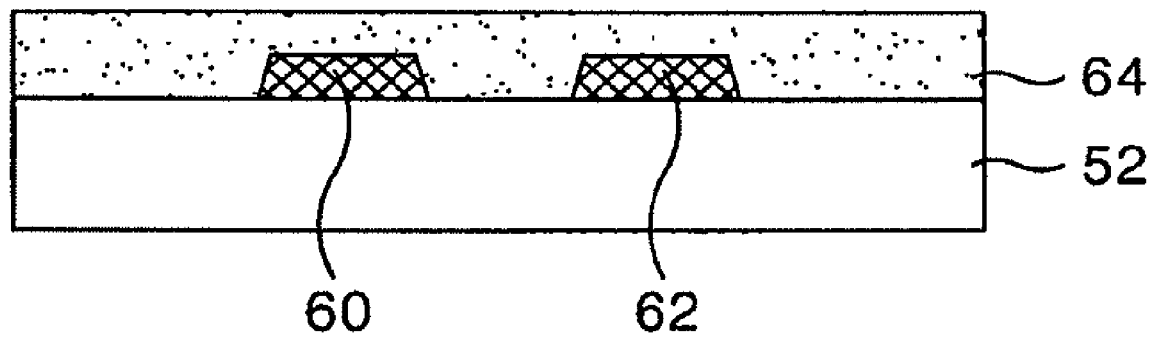
Figure 3C:
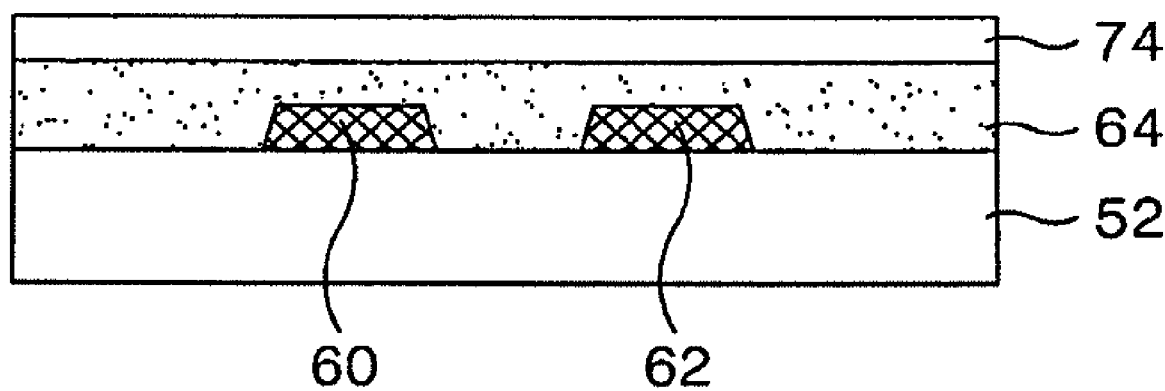
Figure 3D:
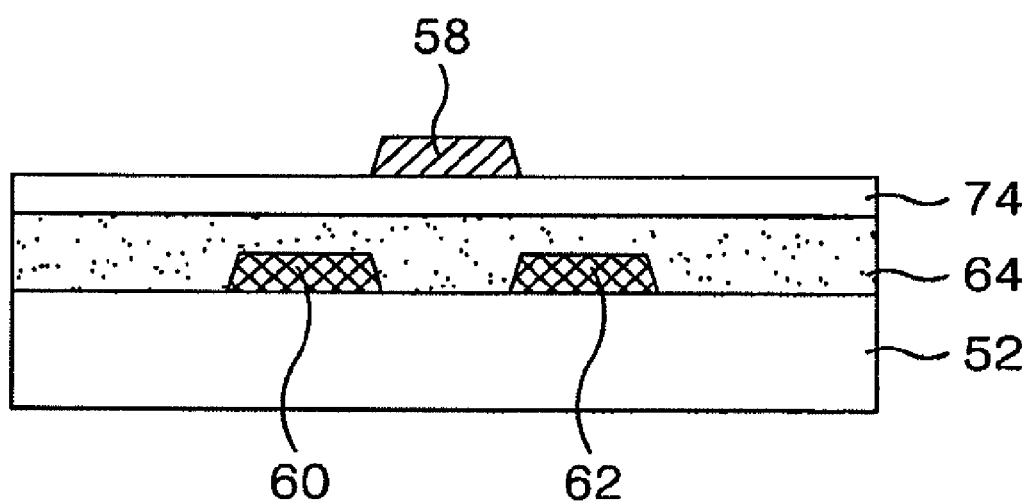

As mentioned above, in the organic TFT and the fabricating method thereof of the present disclosure, the organic semiconductor layer 164 can be formed by a relatively simple method such as spin coating or spinless coating, for example. Accordingly, the organic TFT has a more simple fabricating process than the inorganic TFT (6, refer to FIG. 1) and can reduce usage of expensive deposition equipment for carrying out sputtering, or PECVD. Consequently, it may be possible to reduce the fabricating cost of the TFT.

Also, the organic TFT and the fabricating method thereof of the present disclosure forms the gate electrode 158 and does not remove the gate photo-resist pattern 175 for forming the gate electrode 158. Consequently, the strip process after forming the organic semiconductor layer 164 may not be required. Accordingly, it may be possible to prevent damage of the organic semiconductor layer 164 by the strip liquid used for removing the gate photo-resist pattern 175.

And, in the organic TFT and the fabricating method thereof of the present disclosure, the organic semiconductor layer 164 is patterned by a dry-etching process using the gate photo-resist pattern 175 and the gate electrode 158 as a mask so that the organic semiconductor layer 164 can be formed without using a photolithography process. Accordingly, the organic semiconductor layer 164 may be patterned into a channel of the organic TFT 156 without damaging the organic semiconductor layer 164 by the developer used in the photolithography process for forming the organic semiconductor layer 164 or the strip liquid in the strip process of the photoresist. As a result, the organic TFT 156 of the present disclosure may be applied to the TFT array substrate to provide the organic TFT array substrate.

Hereinafter, the organic TFT array substrate applied the above-mentioned the organic TFT 156 and the method of fabricating the organic TFT array substrate will be described with reference to FIG. 6 to FIG. 8F.

Figure 6:
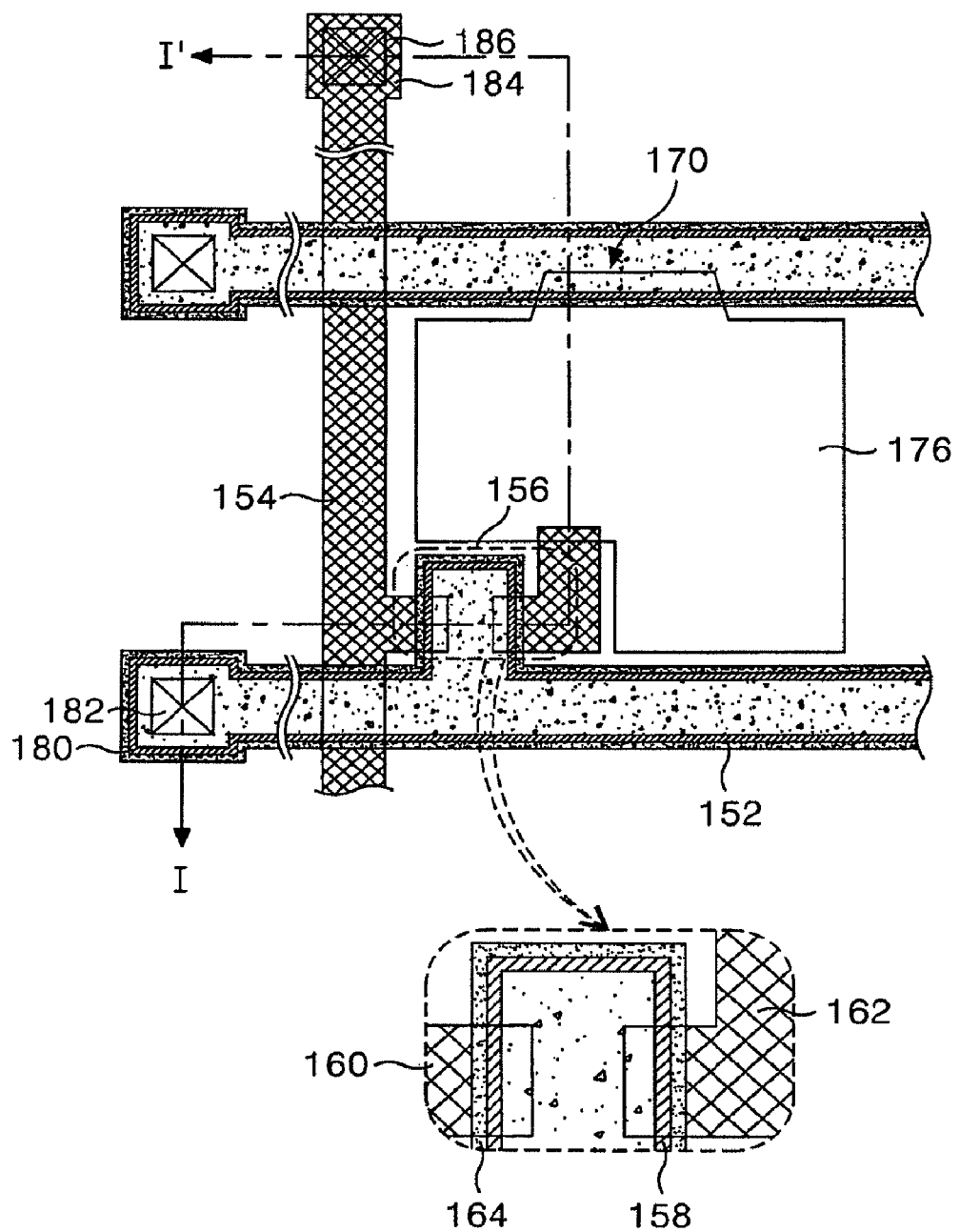
FIG. 6 is a plan view showing an organic TFT array substrate according to an embodiment of the present disclosure applying the organic TFT shown in FIG. 4.
Figure 7:
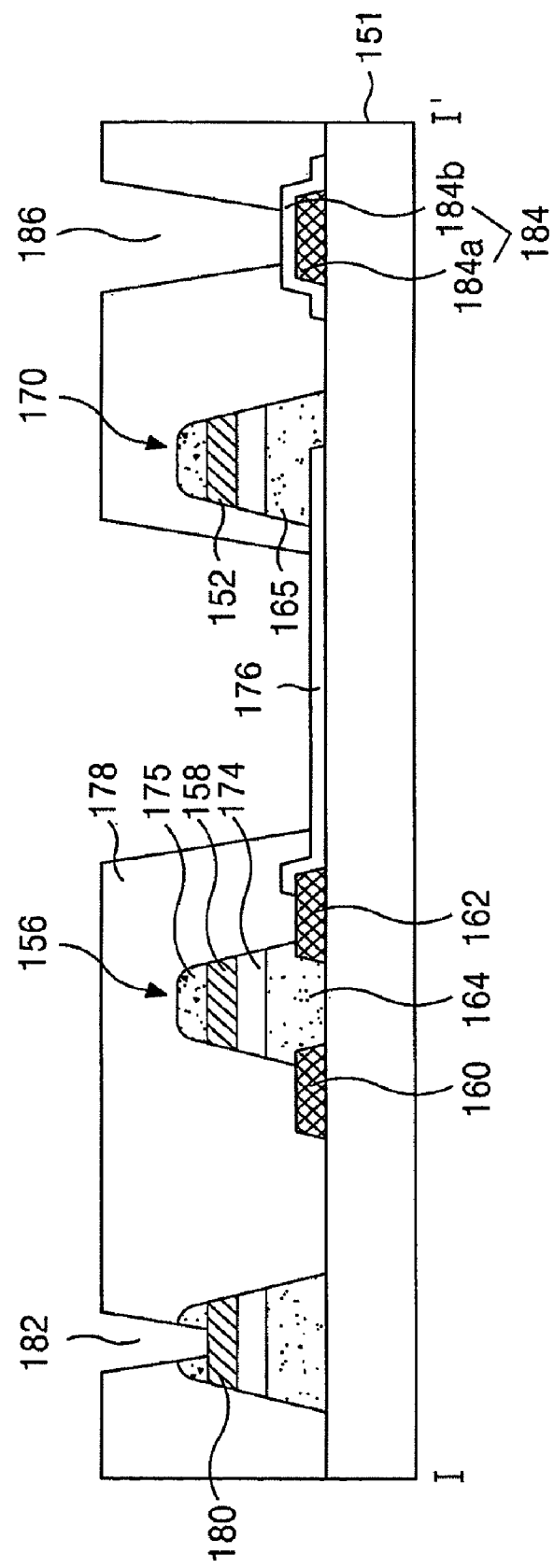
FIG. 7 is a sectional view showing the organic TFT array substrate according to the embodiment of FIG. 6 taken along the I-I' line.

FIG. 6 is a plan view showing an organic TFT array substrate according to an embodiment applying the organic TFT shown in FIG. 4, and FIG. 7 is a sectional view showing the organic TFT array substrate according to the embodiment taken along the I-I' line in FIG. 6.

Referring to FIG. 6 and FIG. 7, an organic TFT array substrate according to the embodiment comprises a gate line 152 and a data line 154 crossing each other on the substrate 151, an organic TFT 156 provided at each intersection between the gate line 152 and the data line 154, and a pixel electrode 176 formed at a cell area arranged by an intersection of the gate line 152 and the data line 154. And, the organic TFT array substrate includes a storage capacitor 170 formed at an overlapping portion of the pixel electrode 176 and a pre-stage gate line, a gate pad 180 connected to the gate line 152 and a data pad 184 connected to the data line 154.

The organic TFT 156 includes the source electrode 160 connected to the data line 154, the drain electrode 162 opposed to the source electrode 160 and connected to the pixel electrode 176, the organic semiconductor layer 164 forming a channel of the organic TFT 156 between the source electrode 160 and the drain electrode 162, the organic gate insulating film 174 formed on the organic semiconductor layer 164 with the same pattern as the organic semiconductor layer 164, and the gate electrode 158 formed on the organic gate insulating film 174 and formed in such a manner as to overlap with the organic semiconductor layer 164. And, the organic TFT 156 includes a gate photo-resist pattern 175 on the gate electrode 158 for patterning the gate electrode 158.

The organic TFT 156 allows a pixel voltage signal applied to the data line 154 to be charged into the pixel electrode 176 and be kept in response to a gate signal applied to the gate line 152.

The pixel electrode 176 is connected to the drain electrode 162 of the organic TFT 156 and exposed at the cell area by the removed protective film 178. The pixel electrode 176 causes an electric potential difference between the charged pixel voltage and a common voltage of a common electrode (not shown). A liquid crystal positioned between the TFT array substrate and a color filter array substrate is rotated by dielectric anisotropy. Thus, a flat display device such as a liquid crystal display device displays a picture.

The storage capacitor 170 is comprised of the pre-stage gate line, and the pixel electrode 176 overlapped with the gate line 152 with the organic gate insulating film 174 therebetween. The storage capacitor 170 allows a pixel voltage charged in the pixel electrode 176 to be stably maintained until the next pixel voltage is charged.

The gate pad 180 is extended from the gate line 152, and is connected to the gate pad hole 182 passing through a gate driver (not shown) and the protective film 178 to allow the gate driver and the gate line 152 to be electrically connected to each other.

The data pad 184 is extended from the data line 154, and is connected, via the data pad hole 186 passing through a data driver (not shown) and the protective film 178 to allow the data driver and the data line 154 to be electrically connected to each other. The data pad 184 includes a lower data pad electrode 184a extended from the data line 154, and an upper data pad electrode 184b formed in such a manner as to cover the lower data pad electrode 184a.

Hereinafter, the method of fabricating the organic TFT array substrate according to the embodiment of the present invention will be described with reference to FIG. 8A to FIG. 8F.

Referring to FIG. 8A, the source/drain metal layer is deposited on the substrate 151 by a deposition technique such as sputtering, PECVD, etc. Then, photolithography and etching processes using the first mask are carried out to form a source/drain metal pattern including the source electrode 160, the drain electrode 162, the lower data pad electrode 184a and a data line (not shown). The source/drain metal is made of Au, Mo, Ti, Ta, Mo-alloy, Cu and an Al-group metal, etc.

Next, a transparent conductive material is deposited on the substrate 151 provided with the source/drain metal pattern by deposition technique such as sputtering or PECVD, for example. Then, photolithography and etching processes using the second mask are carried out to form a transparent conductive pattern including the pixel electrode 176 connected to the drain electrode 162, and the upper data pad electrode 184b covering the lower data pad electrode 184a shown in FIG. 8B. In this case, the data pad 184 comprised of the lower data pad electrode 184a and the upper data pad electrode 184b covering the lower data pad electrode 184a is completed. The transparent conductive material is made of indium tin oxide (ITO), indium zinc oxide (IZO), etc.

Next, the organic semiconductor material and the organic insulating material are sequentially coated on the substrate 151 provided with the transparent conductive pattern by a method such as spin coating or spinless coating, etc. Then, they are hardened at a temperature of approximately 80° C.~120° C. for one to five minutes to form an organic semiconductor material layer 164a and an organic insulating material layer 174a on the whole surface of the substrate 151 shown in FIG. 8C. The organic semiconductor material may be made of, for example, pentacene-group material, polythiophene-group material or polyarylamine-group material, and the organic insulating film may be made of an acrylic organic compound such as BCB or PFCB.

Figure 8C:
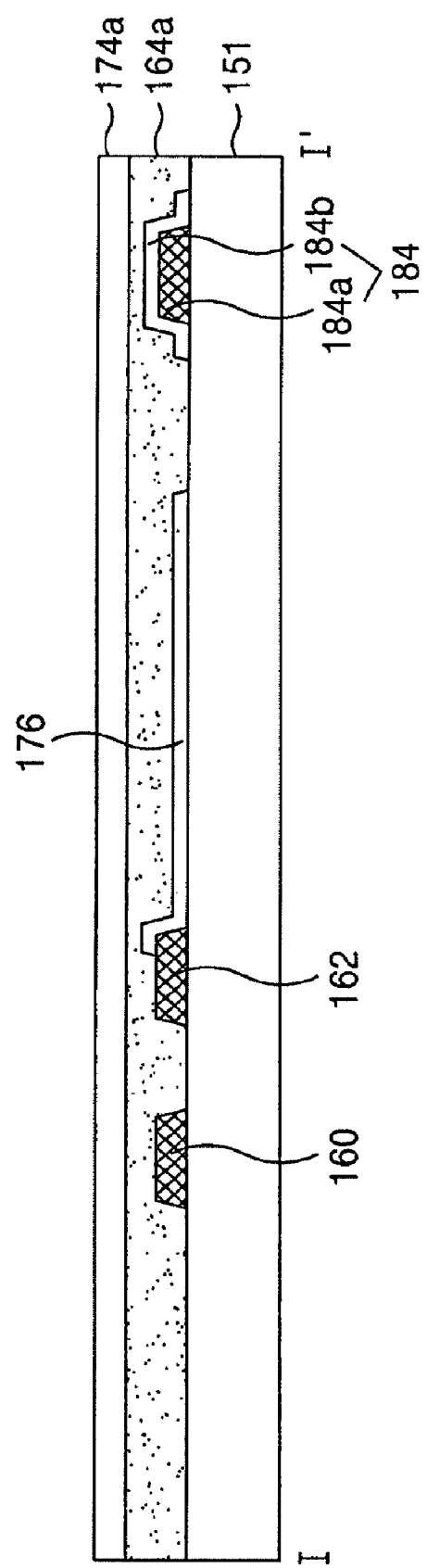
Figure 8D:
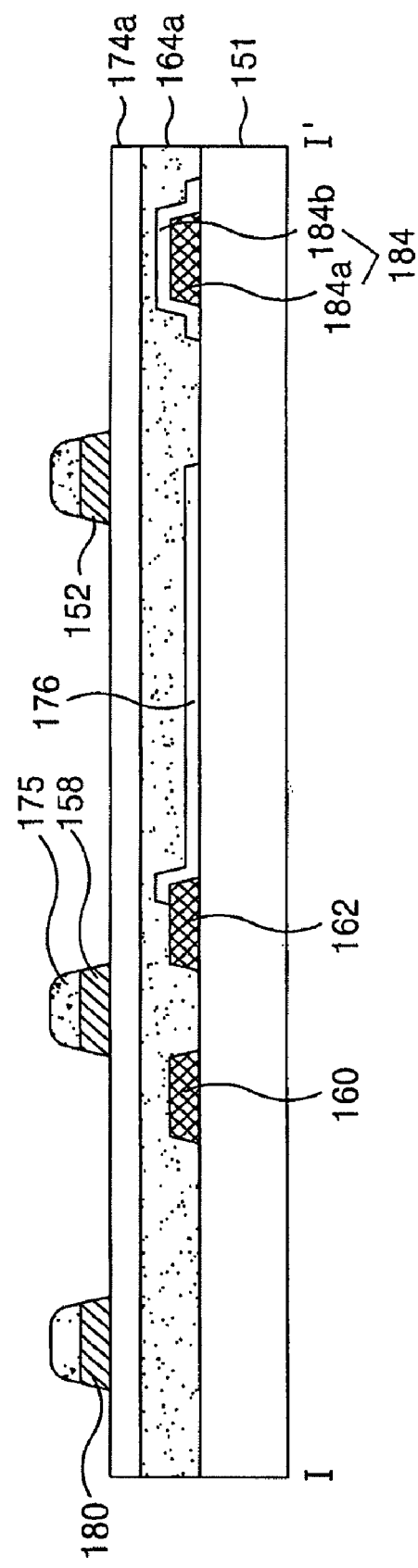

Next, the gate metal layer and the photo-resist film are deposited on the organic semiconductor material layer 164a and the organic insulating material layer 174a by a deposition technique such as sputtering, for example. Then, the gate photo-resist pattern 175 is formed by photolithography using a third mask. Further, a gate electrode pattern including the gate electrode 158, the gate line 152 and the gate pad 180 is formed by carrying out an etching process using the gate photo-resist pattern 175 as a mask as shown in FIG. 8D.

Next, the organic semiconductor material layer 164a and the organic insulating material layer 174a are patterned by a dry-etching process using the gate photo-resist pattern 175 and the gate electrode pattern as a mask to form an organic material pattern including the organic semiconductor layer 164 forming a channel of the organic TFT 156, and the organic gate insulating film 174 shown in FIG. 8E. A dummy organic semiconductor layer 165 is formed under all areas provided with the gate electrode pattern other than an area provided with the organic semiconductor layer 164. Herein, the method of fabricating the organic TFT array substrate of the present disclosure forms the organic material pattern, but does not perform the removal processing of the gate photo-resist pattern 175 on the gate electrode pattern using the strip process. The gate metal is made of Mo-group metal including Mo and Mo-alloy, etc.

Figure 8F:
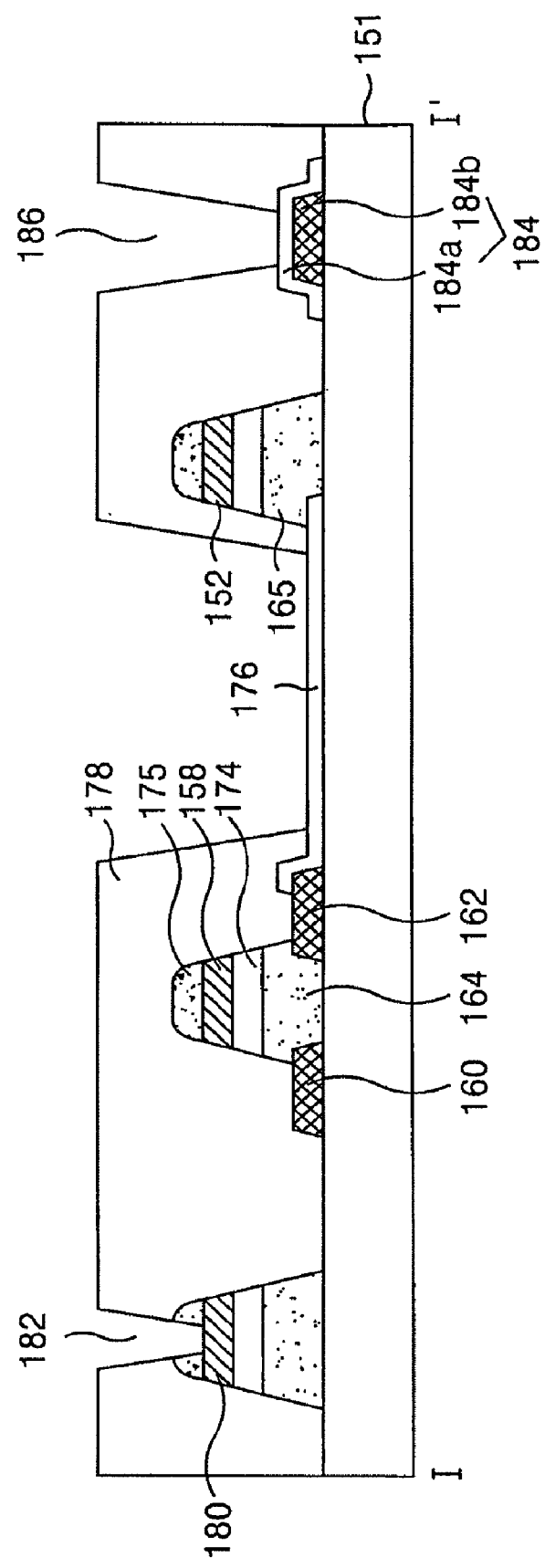

And, photoacryl or another material is entirely coated on the substrate 151 provided with the organic material pattern by a method such as spin coating or spinless coating, for example, and hardened at a temperature of approximately 80° C.~120° C. for one to five minutes. After that, patterning is carried out by photolithography using a fourth mask to expose the pixel electrode 176 at the cell area, and form the protective film 178 including the gate pad hole 182 exposing the gate pad 180 and the data pad hole 186 exposing the upper data pad electrode 184b, as shown in FIG. 8F. After forming the protective film 178, it is hardened at a temperature of approximately 120° C.~170° C. for thirty minutes to two hours.

As above-mentioned, in the organic TFT array substrate and the fabricating method thereof of the present disclosure, the organic semiconductor layer 164 can be formed by a relatively simple method such as spin coating or spinless coating, for example. Accordingly, the organic TFT has a more simple fabricating process than the inorganic TFT array substrate using the inorganic TFT (6, refer to FIG. 1) and can reduce use of expensive deposition equipment. Therefore, it may be possible to reduce the fabricating cost of the TFT.

Also, the organic TFT array substrate and the fabricating method thereof of the present disclosure forms the gate electrode pattern and does not remove the gate photo-resist pattern 175 for forming the gate electrode pattern, thus eliminating the strip process after forming the organic semiconductor layer 164. Accordingly, it becomes possible to prevent damage to the organic semiconductor layer 164 by the strip liquid for removing the gate photo-resist pattern 175.

And, in the organic TFT array substrate and the fabricating method thereof of the present disclosure, the organic semiconductor layer 164 is patterned by a dry-etching process using the gate photo-resist pattern 175 and the gate electrode pattern as a mask to form the organic semiconductor layer 164 without using a photolithography process. Accordingly, the organic semiconductor layer 164 is patterned into a channel of the organic TFT 156 without damage to the organic semiconductor layer 164 by a developer and an etchant in the photolithography process for forming the organic semiconductor layer 164 and a strip liquid in the strip process of the photo-resist.

Herein, in the organic TFT array substrate according to another embodiment, the above-mentioned second mask process is carried out prior to the first mask process to thereby form the pixel electrode 176 at a lower portion of the source/drain metal pattern shown in FIG. 9. In this case, the upper data pad electrode 184b is extended from the data line (not shown) differently from the data pad 184 of the organic TFT array substrate shown in FIG. 6.

As above-mentioned, in the organic TFT and the fabricating method thereof of the present disclosure, the organic semiconductor layer 164 can be formed by a relatively simple method such as spin coating or spinless coating, for example. Accordingly, the organic TFT has a more simple fabricating process than the inorganic TFT array substrate using the inorganic TFT and can reduce use of expensive deposition equipment for carrying out sputtering or PECVD. Therefore, it may be possible to reduce the fabricating cost of the TFT and the TFT array substrate.

Also, the organic TFT array substrate and the fabricating method thereof of the present disclosure forms the gate electrode pattern and does not remove the gate photo-resist pattern for forming the gate electrode pattern, thereby eliminating the strip process after forming the organic semiconductor layer. Accordingly, it becomes possible to prevent damage to the organic semiconductor layer by the strip liquid for removing the gate photo-resist pattern.

And, in the organic TFT array substrate and the fabricating method thereof of the present disclosure, the organic semiconductor layer is patterned by a dry-etching process using the gate photo-resist pattern and the gate electrode pattern as a mask to form the organic semiconductor layer without using photolithography. Accordingly, the organic semiconductor layer may be patterned into a channel of the organic TFT without damaging the organic semiconductor layer by a developer in a photolithographic development process or by a strip liquid in the strip process of the photo-resist.

Although the present invention has been explained by the embodiments shown in the drawings described above, it should be understood to the person of ordinary skill in the art that the invention is not limited to the embodiments, but rather that various changes or modifications thereof are possible without departing from the spirit of the invention. Accordingly, the scope of the invention shall be determined only by the appended claims and their equivalents.

The invention claimed is:

1. A method of fabricating an organic TFT array substrate comprising the steps of:
    forming on a substrate a source/drain metal pattern including a data line, a source electrode connected to the data line, and a drain electrode disposed a predetermined distance from the source electrode;
    forming a pixel electrode connected to the drain electrode;
    sequentially disposing an organic semiconductor material, an organic insulating material, a gate metal layer and a photo-resist film on the substrate provided with the source/drain metal pattern;
    patterning the photo-resist film to form a photo-resist pattern at an area to be provided with a gate metal pattern;
    forming the gate metal pattern using the photo-resist pattern as a mask; and
    patterning the organic insulating material and the organic semiconductor material using the photo-resist pattern and the gate metal pattern as a mask to form an organic gate insulating film and to form an organic semiconductor layer providing a channel between the source electrode and the drain electrode.

2. The method of fabricating the organic TFT array substrate as claimed in claim 1, wherein the gate metal pattern includes a gate line crossing the data line and a gate electrode connected to the gate line.

3. The method of fabricating the organic TFT array substrate as claimed in claim 1, wherein patterning the organic insulating material and the organic semiconductor material comprises a dry-etching process.

4. The method of fabricating the organic TFT array substrate as claimed in claim 1, further comprising the step of: depositing a protective film on the substrate and forming by a photolithography process a hole passing therethrough to expose the pixel electrode.

5. The method of fabricating the organic TFT array substrate as claimed in claim 1, wherein said organic semiconductor material and the organic insulating material are disposed on the substrate by one of spin coating and spinless coating.

6. The method of fabricating the organic TFT array substrate as claimed in claim 1, wherein said gate electrode, the organic gate insulating film and the organic semiconductor layer are formed in such a manner to have the same pattern.

7. The method of fabricating the organic TFT array substrate as claimed in claim 1, wherein said organic semiconductor layer includes any at least one of pentacene-group material, polythiophene-group material and polyarylamine-group material.

8. The method of fabricating the organic TFT array substrate as claimed in claim 1, wherein said photo-resist pattern includes a photoacryl.

9. The method of fabricating the organic TFT array substrate as claimed in claim 1, wherein said gate metal includes Mo.

10. The method of fabricating the organic TFT array substrate as claimed in claim 4, wherein said protective film includes a photoacryl.

11. The method of fabricating the organic TFT array substrate as claimed in claim 1, further comprising the steps of:
    forming a gate pad connected to the gate line to supply a gate signal to the gate line; and
    forming a data pad connected to the data line to supply a data signal to the data line.

12. The organic TFT array substrate as claimed in claim 11, further including the step of:
    forming a gate pad hole passing through a protective film on the substrate to expose the gate pad, and a data pad hole passing through the protective film to expose the data pad.

13. The method of fabricating the organic TFT array substrate as claimed in claim 1, further comprising the step of:
    forming a storage capacitor at an area where the pixel electrode overlaps the gate line with the organic gate insulating film therebetween.

* * * * *